United States Patent
Azzouz et al.

(10) Patent No.: US 9,209,376 B2
(45) Date of Patent: Dec. 8, 2015

(54) THERMOELECTRIC DEVICE, IN PARTICULAR INTENDED TO GENERATE AN ELECTRIC CURRENT IN A MOTOR VEHICLE

(75) Inventors: Kamel Azzouz, Paris (FR); Michel Simonin, Voisins le Bretonneux (FR)

(73) Assignee: VALEO SYSTEMES THERMIQUES, Le Mesnil, Saint Denis (FR)

( * ) Notice: Subject to any disclaimer, the term of this patent is extended or adjusted under 35 U.S.C. 154(b) by 265 days.

(21) Appl. No.: 13/876,726

(22) PCT Filed: Jul. 28, 2011

(86) PCT No.: PCT/EP2011/063021
§ 371 (c)(1),
(2), (4) Date: Oct. 8, 2013

(87) PCT Pub. No.: WO2012/041558
PCT Pub. Date: Apr. 5, 2012

(65) Prior Publication Data
US 2014/0026932 A1    Jan. 30, 2014

(30) Foreign Application Priority Data

Sep. 29, 2010    (FR) ...................................... 10 57879

(51) Int. Cl.
*H01L 35/30* (2006.01)
*F28F 1/32* (2006.01)

(52) U.S. Cl.
CPC .. *H01L 35/30* (2013.01); *F28F 1/32* (2013.01)

(58) Field of Classification Search
CPC .................................... H01L 35/30; F28F 1/32
See application file for complete search history.

(56) References Cited

U.S. PATENT DOCUMENTS

| | | |
|---|---|---|
| 5,584,183 A | 12/1996 | Wright et al. |
| 2005/0087222 A1 | 4/2005 | Muller-Werth |
| 2007/0220902 A1 | 9/2007 | Matsuoka et al. |
| 2011/0154811 A1 | 6/2011 | Simonnin |

FOREIGN PATENT DOCUMENTS

| | | | |
|---|---|---|---|
| EP | 1515376 A2 | | 3/2005 |
| FR | WO 2009-156361 | * | 3/2009 |

(Continued)

OTHER PUBLICATIONS

English language abstract for EP 1515376 extracted from the espacenet.com database on Jun. 7, 2013, 9 pages.

(Continued)

*Primary Examiner* — Jayne Mershon
(74) *Attorney, Agent, or Firm* — Howard & Howard Attorneys PLLC

(57) ABSTRACT

The invention relates to a thermoelectric device, comprising a first circuit (1), called hot circuit, through which a first fluid can flow, and, a second circuit (2), called cold circuit, through which a second fluid can flow at a temperature lower than that of the first fluid, and elements (3p, 3n), called thermoelectric elements, that can be used to generate an electric current in the presence of a temperature gradient. According to the invention, it comprises fins (5f) in a heat exchange relationship with said hot circuit (1) and/or said cold circuit (2), the thermoelectric elements (3p, 3n) being in contact at least with said fins (5f), said fins having tracks (32) for conducting the current generated by said thermoelectric elements.

20 Claims, 4 Drawing Sheets

(56) References Cited

FOREIGN PATENT DOCUMENTS

| WO | WO 96/11372 A1 | 4/1996 |
| WO | WO 2009/156361 A1 | 12/2009 |
| WO | WO 2012/041559 A1 | 4/2012 |
| WO | WO 2012/041561 A1 | 4/2012 |
| WO | WO 2012/041562 A1 | 4/2012 |
| WO | WO 2012041560 A1 | 4/2012 |

OTHER PUBLICATIONS

English language abstract for WO 2009/156361 extracted from the espacenet.com database on Jun. 7, 2013, 40 pages.

English language abstract and machine-assisted English translation for WO 2012041560 extracted from the espacenet.com database on Jun. 11, 2013, 42 pages.

English language abstract and machine-assisted English translation for WO 2012041559 extracted from the espacenet.com database on Jun. 10, 2013, 46 pages.

English language abstract and machine-assisted English translation for WO 2012041561 extracted from the espacenet.com database on Jun. 11, 2013, 42 pages.

English language abstract and machine-assisted English translation for WO 2012/041562 extracted from the espacenet.com database on Jun. 11, 2013, 52 pages.

International Search Report for Application No. PCT/EP2011/063021 dated Aug. 17, 2011; 5 pages.

International Search Report for Application No. PCT/EP2011/063025 dated Aug. 29, 2011; 5 pages.

International Search Report for Application No. PCT/EP2011/063026 dated Aug. 17, 2011; 5 pages.

International Search Report for Application No. PCT/EP2011/063029 dated Aug. 29, 2011; 5 pages.

International Search Report for Application No. PCT/EP2011/063033 dated Aug. 29, 2011; 7 pages.

\* cited by examiner

THERMOELECTRIC DEVICE, IN PARTICULAR INTENDED TO GENERATE AN ELECTRIC CURRENT IN A MOTOR VEHICLE

RELATED APPLICATIONS

This application is the National Stage of International Patent Application No. PCT/EP2011/063021, filed on Jul. 28, 2011, which claims priority to and all the advantages of French Patent Application No. FR 10/57879, filed on Sep. 29, 2010, the content of which is incorporated herein by reference.

The present invention relates to a thermoelectric device, in particular intended to generate an electrical current in a motor vehicle.

BACKGROUND

Thermoelectric devices have already been proposed that use elements, called thermoelectric elements, that make it possible to generate an electric current in the presence of a temperature gradient between two of their opposing faces by the phenomenon known as Seebeck effect. These devices comprise a stack of first pipes, intended for the circulation of the exhaust gases from an engine, and second pipes, intended for the circulation of a heat-transfer fluid of a cooling circuit. The thermoelectric elements are sandwiched between the pipes so as to be subjected to a temperature gradient originating from the temperature difference between the hot exhaust gases and the cold coolant.

Such devices are of particular interest because they make it possible to produce electricity from a conversion of the heat originating from the engine exhaust gases. They thus offer the possibility of reducing the fuel consumption of the vehicle by replacing, at least partially, the alternator usually provided therein to generate electricity from a belt driven by the crankshaft of the engine.

One drawback of the known devices is that they require a very good contact to be assured between the thermoelectric elements and the pipes. It is thus necessary to have pipes that have a flatness and a surface finish that have an impact on the cost price of the device.

A first solution, consisting in reinforcing the contact by virtue of tie rods exerting a force on the stack of pipes, has been tested. This solution does, however, require the use of pipes that do risk being crushed on themselves under the effect of this force, resulting in an overconsumption of material.

SUMMARY OF THE INVENTION

The invention aims to improve the situation by proposing a thermoelectric device, comprising a first circuit, called hot circuit, through which a first fluid can flow, and a second circuit, called cold circuit, through which a second fluid can flow at a temperature lower than that of the first fluid, and elements, called thermoelectric elements, that can be used to generate an electric current in the presence of a temperature gradient.

According to the invention, it comprises fins in a heat exchange relationship with said hot circuit and/or said cold circuit, said thermoelectric elements being in contact at least with said fins.

By associating the thermoelectric elements with fins, the intimacy of the contact between them and the components, hot and/or cold, of the device, with which they have to be in contact in order to be subjected to a temperature gradient, is facilitated. In practice, the need to establish a close link between the thermoelements and the component(s) creating the temperature gradient necessary to their operation is no longer borne by the fluid circulation pipes but by a specific component, the fins, which can therefore be chosen for that, at least for one of said hot or cold circuits. The technical solutions used to establish an effective heat bridge between, on the one hand, the fins and the pipes and, on the other hand, the fins and the thermoelements, will therefore be able to be optimized separately.

Provision is also made, according to the invention, for said fins to have tracks for conducting the current generated by said thermoelectric elements. There is thus a great degree of freedom to maneuver in how to have the current generated by each of the thermoelectric elements flow on the surface of the fins, and it will be possible to group the current conducting tracks in circuits having the desired topology.

According to different embodiments:
- the fins have a core made of metal material, provided with two faces, coated with a thermally conductive and electrically insulating substrate on at least one of the faces of the core, said tracks being provided on a face of the substrate opposite the face of the substrate in contact with the core,
- the substrate is made of a ceramic material,
- the tracks are made of copper,
- said tracks extend to the periphery of the fins to form connection terminals,
- electrical connectors are provided between at least some of said fins, said connectors being linked to said connection terminals to allow the thermoelectric elements linked to said terminals to be set to the same potential,
- said fins are grouped in pairs, a compressible material being provided between the fins of one and the same pair, said fins having tracks only on their face opposite that which is in contact with the compressible material.

By providing a compressible material between the fins, a solution is obtained that makes it possible to absorb, in said compressible material, the mechanical stress generated by the heat expansion of the pipes. This prevents it from being propagated to the thermoelements. Said compressible material will be able to be electrically insulating.

According to a first embodiment:
- the hot circuit comprises pipes, called hot pipes, for the circulation of the hot fluid,
- said cold circuit comprises pipes, called cold pipes, for the circulation of the cold fluid,
- said fins, called cold fins, are in a heat exchange relationship with the cold pipes,
- the thermoelectric elements are in a heat exchange relationship, on the one hand, with the hot pipes and, on the other hand, with the cold fins.

According to this embodiment, the hot pipes will themselves be able to be provided with tracks for the conduction of the current generated by said thermoelectric elements.

According to another embodiment:
- said hot circuit comprises pipes, called hot pipes, for the circulation of the hot fluid,
- said cold circuit comprises pipes, called cold pipes, for the circulation of the cold fluid,
- for a first part, said fins, called cold fins, are in a heat exchange relationship with said cold pipes,
- for the other part, said fins, called hot fins, are in a heat exchange relationship with said hot pipes, said thermoelectric elements are provided in a heat exchange relationship, on the one hand, with the cold fins and, on the other hand, with the hot fins.

According to various exemplary implementations of this embodiment:

the cold fins are grouped in pairs, called cold pairs, and said compressible material is provided between the fins of one and the same pair, the cold fins and the hot fins are grouped in pairs, respectively called cold pair, hot pair, and said compressible material is provided between the fins of one and the same pair for the cold pairs and the hot pairs.

Moreover, it will be possible to provide for:

the thermoelectric elements to be hard soldered on the tracks of the fins in a heat exchange relationship with the cold circuit, the thermoelectric elements to be bonded to the tracks of the fins in a heat exchange relationship with the hot pipes or the tracks of the hot pipes.

BRIEF DESCRIPTION OF THE DRAWINGS

The invention will be better understood in light of the following description which is given purely as an indication and which is in no way intended to impose a limitation thereon, accompanied by the attached drawings in which.

DETAILED DESCRIPTION

Figure 1:
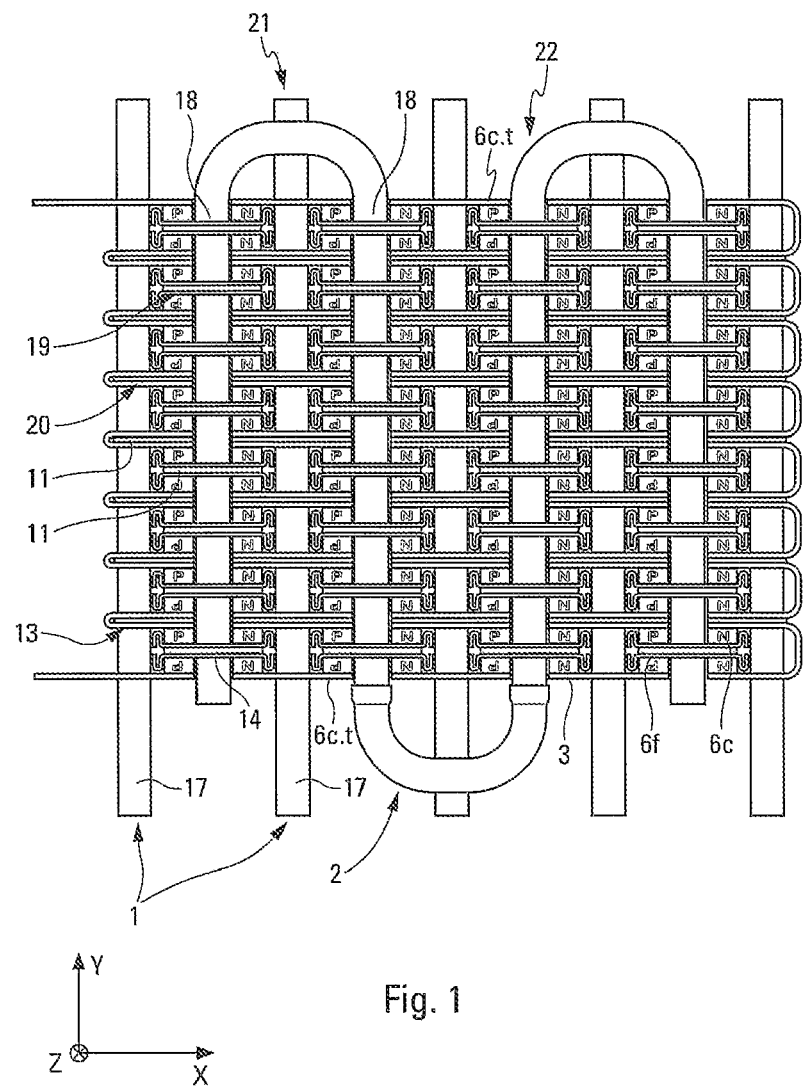
FIG. 1 schematically illustrates a partial cross-sectional view of an exemplary embodiment of the device according to the invention, the cross section being made in a plane orthogonal to the longitudinal axis of the fins, FIG. 2 reprises FIG. 1 in a variant embodiment, FIG. 2a details a part known as 2a in FIG. 1.

As illustrated in FIGS. 1 to 4, the invention relates to a thermoelectric device, comprising a first circuit 1, called hot circuit, through which a first fluid can flow, in particular exhaust gases from an engine, and a second circuit 2, called cold circuit, through which a second fluid can flow, in particular a heat transfer fluid of a cooling circuit, at a temperature lower than that of the first fluid.

The device also comprises elements 3, called thermoelectric elements, that make it possible to generate an electric current in the presence of a temperature gradient.

These are, for example, elements of substantially parallelepipedal form generating an electric current, by the Seebeck effect, when they are subjected to said gradient between two of their opposing faces 4a, 4b, called active faces. Such elements make it possible to create an electric current in a load connected between said active faces 4a, 4b. As is known to the person skilled in the art, such elements consists, for example, of bismuth and tellurium ($Bi_2Te_3$).

The thermoelectric elements are, for a first part, elements 3p of a first type, called P, making it possible to establish an electrical potential difference in one direction, called positive, when they are subjected to a given temperature gradient, and, for the other part, elements 3n of a second type, called N, making it possible to create an electrical potential difference in an opposite direction, called negative, when they are subjected to the same temperature gradient.

The device also comprises fins 5f, 6c, 6f in a heat exchange relationship with said hot circuit and/or said cold circuit. A temperature gradient is thus ensured between said fins or between the fins in a heat exchange relationship with one of said circuits and the other circuit. Said fins 5f, 6c, 6f are also in contact with the thermoelectric elements 3p, 3n on, in particular, their active face 4a, 4b. In other words, the thermoelectric elements are arranged either between two fins, or between one of the fins in a heat exchange relationship with one of the circuits and the other circuit. A current generation by the thermoelectric elements 3, 3p, 3n is thus assured.

According to the invention, it is therefore the fins 5f, 6c, 6f which fulfill the function of establishing the thermal contact with the thermoelements, at least for one of the circuits.

A fin should be understood to be an element having two large planar opposing surfaces 7a, 7b with a thickness very much less than its width and its length, making it possible to establish a surface contact, for example, between one of said large surfaces 7a and the thermoelectric elements 3p, 3n on their opposing face of faces 4a, 4b to be subjected to a temperature gradient to generate an electric current.

Figure 2:
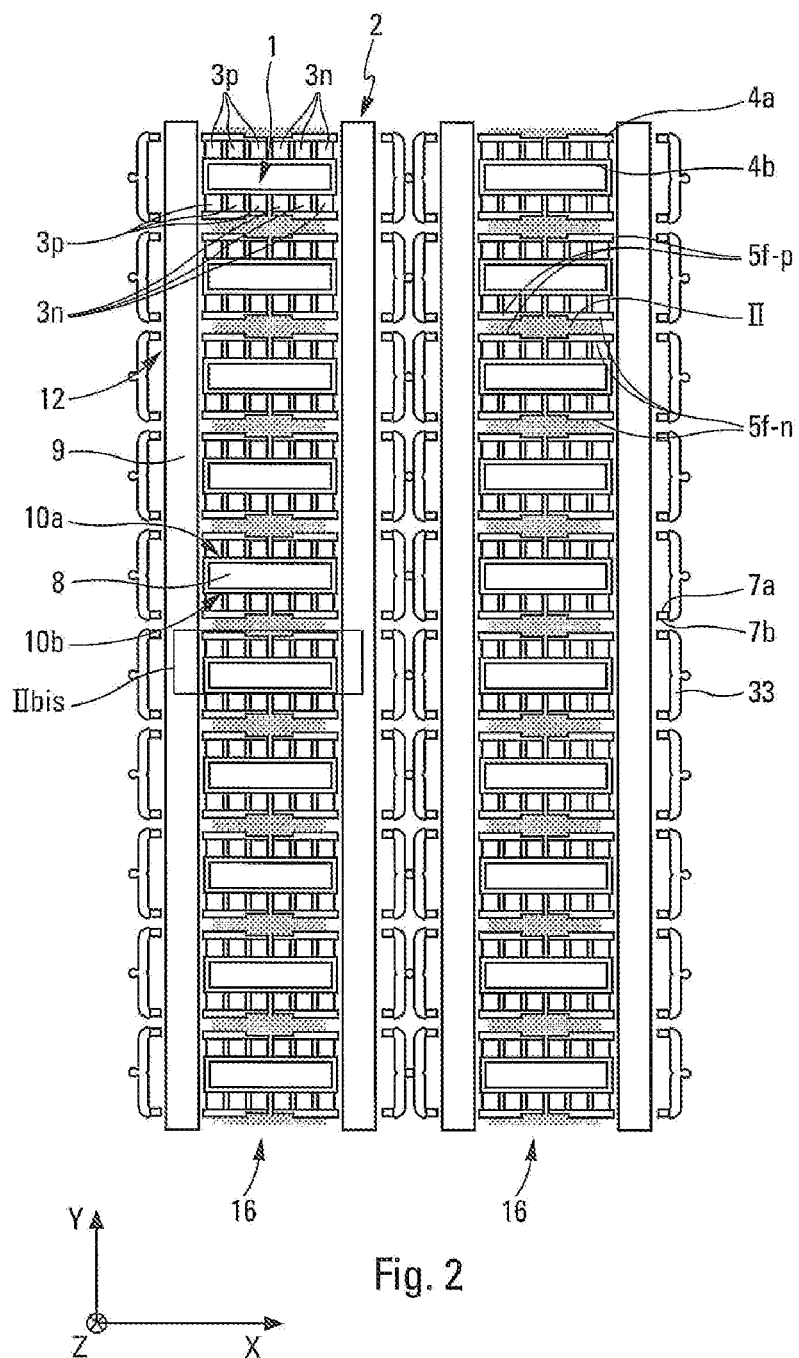
Figure 2A:
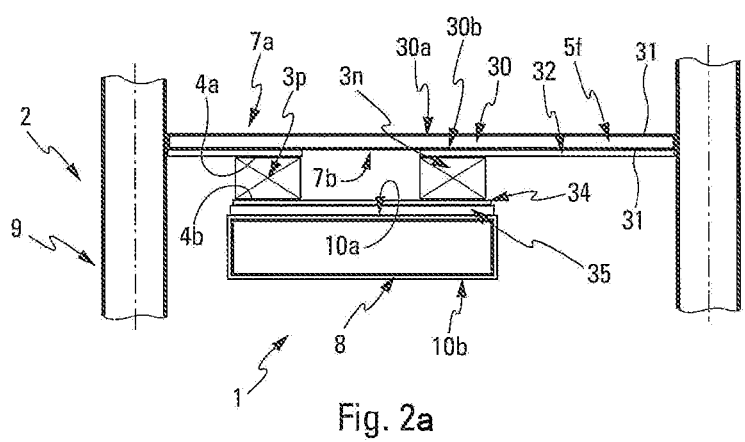

Moreover, as more particularly illustrated in FIG. 2a, said fins 5f have tracks 32 for conducting the current generated by said thermoelectric elements 3p, 3n. It will thus be possible to conduct the current, according to any desired circuit topology, on the surface of the fins by grouping together the tracks 32 in series and/or in parallel.

Obviously, although the tracks 32 are represented only in relation to the embodiment of FIG. 2, they are also present, according to the invention, on the fins 6f, 6c of the other embodiments illustrated and the following features can also be applied to them.

The fins 5f have, for example, a core 30 of metal material, provided with two faces 30a, 30b. The core 30 is coated with a thermally conductive and electrically insulating substrate 31 on at least one of the faces 30a, 30b of the core. The latter is, for example, made of aluminum or aluminum alloy.

The substrate is made, for example, of a ceramic material, chosen for its electrically insulating and thermally conductive properties. It will be able to be a ceramic layer of alumina type ($Al_2O_3$), a few micrometers thick. The tracks 32 are made, notably, of copper.

Said tracks 32 will be able to extend to the periphery of the fins 5f to form connection terminals which will allow, for example, a connection of electrical connectors 33 (represented notably in FIG. 2) provided between at least some of said fins 5f, 6f, 6c. This way, one allows the fins that have said terminals, or, more specifically, the thermoelectric elements in contact with the tracks of said fins linked to said terminals, to be set to the same potential.

Referring again to FIGS. 1 and 2, it will be observed that at least some of said fins 5f, 6c, 6f are associated in pairs, a compressible material 11 being provided between the fins of one and the same pair. It is thus possible to ensure an absorption of the mechanical stress generated by the expansion of the hot and/or cold circuits at the level of said material.

Said fins associated in pairs thus have tracks 32 only on their face opposite that which is in contact with the compressible material 11.

In each pair, the fins 5f, 6c, 6f have, for example, identical dimensions and are arranged parallel to one another, one of the large faces 7b of one of the fins 5 being arranged facing one of the large faces 7b of the other of the fins of the pair. Said compressible material 11 will be able to be electrically insulating.

Referring now more specifically to the embodiment of FIG. 2, it will be observed that the hot circuit comprises pipes 8, called hot pipes, for the circulation of the hot fluid. As for the cold circuit, it comprises pipes 9, called cold pipes, for the circulation of the cold fluid. The fins 5f, called cold fins, are in a heat exchange relationship with the cold pipes 9. Also, the thermoelectric elements 3p, 3n are in a heat exchange relationship, on the one hand, with the hot pipes 8 and, on the other hand, with the cold fins 5f. Said cold fins 5f are here grouped in pairs, said compressible material 11 being provided between the fins of one and the same pair.

Said hot pipes 8 are, for example, substantially flat pipes comprising two large parallel opposing faces 10a, 10b, on which are arranged the thermoelectric elements 3p, 3n by one of their active faces 4a, 4b. They are configured to allow for the circulation of exhaust gas and are, in particular, made of stainless steel. They are formed, for example, by profiling, welding and/or hard soldering. They will be able to have a plurality of channels for the passage of the first fluid, separated by partitions linking the opposing planar faces of the pipes.

As illustrated in FIG. 2a, the hot pipes 8 are also provided with tracks 34 for the conduction of the current generated by said thermoelectric elements. More specifically, here, the hot pipes 8 are coated on said large faces 10a, 10b with a layer of electrically insulating and thermally conductive material 35, for example a ceramic layer, on which are provided said tracks 34 which link, for example in copper, in series and/or in parallel, all or part of the thermoconductive elements arranged on the hot pipes 8, this being for each of their faces 10a, 10b.

The cold fins 5f have, for example, orifices 12 for the passage of the cold pipes 9. Said cold pipes are, for example, made of aluminum or of copper and have a round and/or oval section.

The contact between the pipes 9 and the cold fins 5f is produced, for example, by an expansion of the material of the pipes as in the heat exchangers known as mechanical exchangers in the field of heat exchangers for motor vehicles.

According to the embodiment illustrated, each planar face 10a, 10b of the hot pipes 8 has associated with it at least two so-called cold fins 5f-p, 5f-n, called neighboring cold fins, provided facing said planar face and electrically insulated from one another. The thermoelectric elements provided between a first 5f-p of said neighboring fins, called P-type fin, and one of said planar faces, are of P-type and the thermoelectric elements provided between the other 5f-n of said two fins, called N-type fin, and said planar face are of N type, so as to create a potential difference between said two neighboring fins 5f-p, 5f-n.

This subassembly consisting of a cold fin 5f-p, of one or more P-type thermoelectric elements, of a face 10a or 10b of the hot pipe 8, of one or more N-type thermoelectric elements and of a cold fin 5f-n defines a basic building block which will be able to be reproduced, the building blocks then being assembled electrically in parallel and/or in series in a different way to allow for the generation of a current exhibiting the desired intensity and/or potential difference.

There now follows a description of an exemplary embodiment of the arrangement of the thermoelectric elements 3p, 3n facing a given hot pipe 8 and of the cold fins 5f provided to correspond, producing a first assembly of the basic building block described above.

P-Type fins 5f-p, respectively N-type 5f-n, are located, for example, on either side of one and the same hot pipe 9 and are electrically connected together in such a way as to associate, in particular, in parallel the thermoelements located on either side of the hot pipe 9.

Said hot pipes are superposed in a first direction Y orthogonal to the fins 5f in one or more ranks 16, said hot pipes 8 of a rank being arranged between two cold pipes 9. Said cold pipes 9 are oriented in the direction Y of stacking of the hot pipes 8.

The hot pipes 8 of each rank 16 are, for example, provided in the extension of one another from one rank 16 to the other. The thermoelements of the hot pipes 8 located in the extension of one another are, for example, connected in series from one rank 16 to the other. In other words, the fins 5f-p, 5f-n located on either side of one and the same hot pipe 8, on one side of said pipe, and the fins 5f-p, 5f-n of the hot pipe 8 located in the extension of the first in the rank of neighboring hot pipes 8 are set to the same potential.

According to the embodiment of FIG. 2, the cold fins 5f-p, 5f-n provided facing one and the same planar face 10a or 10b are two distinct components. In other words, two distinct fins are provided facing each face 10a, 10b of one and the same hot pipe 8. In a variant, illustrated by FIG. 2a, these fins consist of one and the same component. In other words, a single fin is provided facing each of the faces of one and the same pipe 8. It is then the tracks 32 in contact with the P-type thermoelectric elements which are distinct from the tracks 32 in contact with the N-type thermoelectric elements in order to avoid any short circuit. In such a variant, in the case of use of a number of hot pipes 8 situated in the extension of one another in the direction X, a cold fin 5f will be able to be provided, common to all these hot pipes 8, for each of their faces 10a, 10b, the tracks 32 being configured to set the thermoelectric elements of the same type, P or N, of adjacent hot pipes 8, to the same potential.

To refer once again to FIG. 1, according to the embodiment illustrated, said hot circuit comprises pipes 17, called hot pipes, for the circulation of the hot fluid, and said cold circuit comprises pipes 18, called cold pipes, for the circulation of the cold fluid. These are, in particular, round and/or oval pipes, for example made of stainless steel for the hot pipes 17 and of aluminum or of copper for the cold pipes 18.

For a first part, said fins 6f, called cold fins, are in a heat exchange relationship with said cold pipes 18 and, for the other part, said fins 6c, called hot fins, are in a heat exchange relationship with said hot pipes 17.

Said thermoelectric elements 3 are configured in a heat exchange relationship, on the one hand, with the cold fins 6f and, on the other hand, with the hot fins 6c.

As in the cold fins 5f of the preceding embodiment, through-orifices 13, 14 are provided for the hot pipes 17, respectively cold pipes 18, in the hot fins 6c, respectively cold fins 6f. The pipe/fin contact is, in particular, of mechanical type, as described above.

According to the embodiment illustrated, said cold pipes 18 and said hot pipes 17 extend in one and the same direction, called Y, and the hot fins and the cold fins are arranged parallel to one another in planes orthogonal to the direction Y, the fins extending in a first direction, called Z, and in a second direction, called X.

Figure 3:
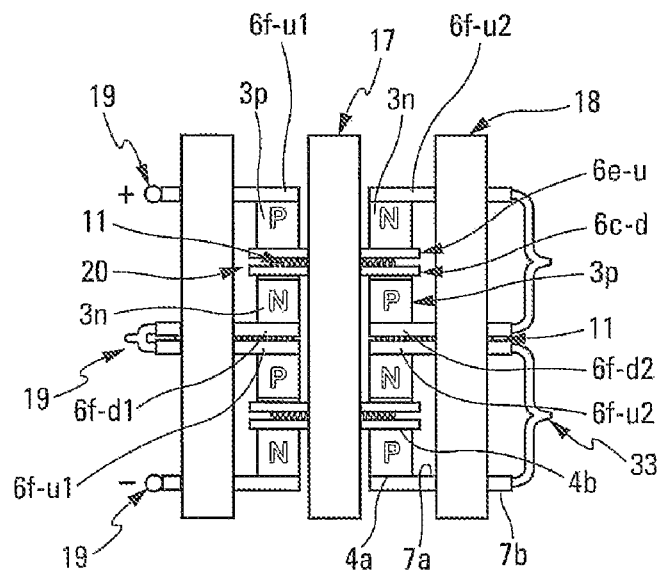
FIG. 3 illustrates a simplified version of the device of FIG. 1, the cold pipes and the hot pipes also being reversed, FIG. 4 reprises FIG. 3 in a variant embodiment.
Figure 5:
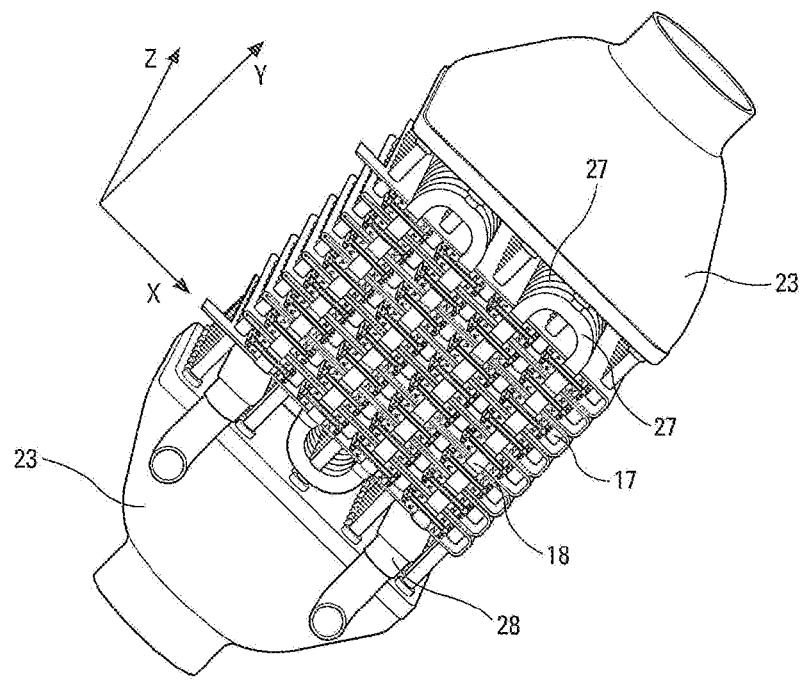
FIG. 5 is a perspective view of the device illustrated in FIG. 1.

According to a first exemplary implementation, corresponding to FIGS. 1, 3 and 5, the cold fins 6f and the hot fins 6c are grouped in pairs, respectively called cold pair 19/hot pair 20, and said compressible material 11 is provided between the fins 6f, 6c of one and the same pair for the cold pairs and the hot pairs.

The hot pairs and the cold pairs are alternated in the direction Y so that at least one so-called cold pair is situated on either side of one so-called hot pair.

At least two cold pairs are provided in the extension of one another in the direction X and electrically insulated from one another, forming a rank of cold fins in the direction X.

As in the preceding embodiment, there is once again here a pattern formed by an assembly of cold fins $6f$ and of hot fins $6c$, separated or not by the compressible material 11, and of thermoelements $3p$, $3n$. Possible different constructions of this pattern and possible different ways of assembling the patterns will be described hereinbelow, in particular from an electrical point of view.

As detailed in FIG. 3, according to a first exemplary embodiment of said pattern, a first of the hot fins $6c$-$u$ of said hot pair 20 is provided facing two cold fins $6f$-$u1$, $6f$-$u2$, of distinct cold pairs, called first and second upstream cold pairs, situated in the extension of one another, on one side of said hot pair 20, the other fin $6c$-$d$ of the same hot pair 20 facing two cold fins $6f$-$d1$, $6f$-$d2$ of distinct cold pairs, called first and second downstream cold pairs, situated in the extension of one another, on the other side of said hot pair 20.

One or more P-type elements are provided between the first $6c$-$u$ of the hot fins and the fin $6f$-$u1$ of the first upstream cold pairs. One or more N-type elements are provided between said first of the hot fins $6c$-$u$ and the cold fin $6f$-$u2$ of the second upstream cold pair.

One or more P-type elements are provided between the other hot fin $6c$-$d$ of said hot pair 20 and the cold fin $6f$-$d2$ of the second downstream pair.

One or more N-type elements are provided between said other hot fin $6c$-$d$ of said hot pair 20 and the cold fin $6f$-$d1$ of the first downstream pair. On either side of the hot pair 20, the upstream P-type elements face downstream N-type elements and the upstream N-type elements face downstream P-type elements.

Referring once again to FIG. 1 in which the hot pipes 17 and the cold pipes 18 are reversed compared to FIG. 3, it will be observed that the device according to the invention will be able to comprise, according to this exemplary implementation, a plurality of hot pairs 20 situated in the extension of one another in the direction X and electrically insulated from one another, so as to form a series of hot pairs in the direction X.

Said hot pairs are also distributed in ranks in which they follow one after the other in the direction Y.

In other words, said series and said ranks of hot pairs follow one another in the directions X and Y.

The cold pairs 19 are also distributed in ranks in which they follow one after the other in the direction Y and/or in series in the direction X. The hot pairs 20 and the cold pairs 19 are, for example, provided in staggered configuration.

The hot pipes 17 are provided, for example, between two ranks of cold pairs 19, in the direction Y, and/or the cold pipes 18 are provided between two ranks of hot pairs 20, in the direction Y.

The succession of hot 20 and/or cold 19 pairs in the direction Y will be able to end on either side, in particular, with a hot fin $6c$-$t$, provided alone, rather than in a pair.

The fins $6c$, $6f$ extend longitudinally in the direction Z and transversally in the direction X and the hot pipes, respectively the cold pipes, are grouped in ranks 21, 22 extending in planes orthogonal to the direction X.

As illustrated in FIG. 5, the device also comprises collecting boxes 23 for the hot fluid into which the hot pipes open by their ends.

The cold pipes and/or the hot pipes are also distributed in ranks extending in planes orthogonal to the direction Z. The cold pipes 18 of one and the same rank orthogonal to Z are linked in pairs by bent ducts 27 linked at their end in such a way as to define a winding circulation of the cold fluid in said rank orthogonal to Z.

The ends of the winding pipes are linked at either end to a collecting box 28 into which they open.

From an electrical point of view, the connections between the fins are produced by the hot fins in FIG. 1. That said, is also possible to produce them by the cold fins and, in FIG. 3, it will be observed that the pattern described above is assembled as follows. The cold fins $6f$-$u2$ of the second upstream pair of a pattern are connected to the cold fins $6f$-$u1$ of the first upstream pair of the neighboring pattern, in the direction X. The same applies for the downstream cold fins $6f$-$d2$, $6f$-$d1$. In addition, whether the device comprises one or more hot pairs:

the cold fin $6f$-$u2$ of the second upstream cold pair and the cold fin $6f$-$d2$ of the second downstream cold pair are set to the same potential, for the fins of the cold pairs located at a first end of the series of cold pairs, the cold fin $6f$-$d1$ of the first downstream cold pair of one of the hot pairs is set to the same potential as the cold fin $6f$-$u1$ of said first upstream cold pair of the following hot pair in the direction Y, said cold fins $6f$-$d2$, $6f$-$u1$ forming part of the same pair of cold fins, for the fins of the cold pairs located at the other end of the series of cold pairs.

At the terminals of the hot fins $6c$-$t$, as in FIG. 1, or cold fins, as in FIG. 3, located at the end of the succession of fins in the direction Y, there is thus a potential difference corresponding to the sum of the potential differences created at the terminals of the successive ranks of hot fins, respectively cold fins $6f$.

According to a particular exemplary embodiment, the fins of the cold pairs $6f$ have, along one and/or the other of their longitudinal sides, a folded edge 29 making it possible to thermally insulate the rest of the fin from a heat radiation from the facing hot pipes 17.

Figure 4:
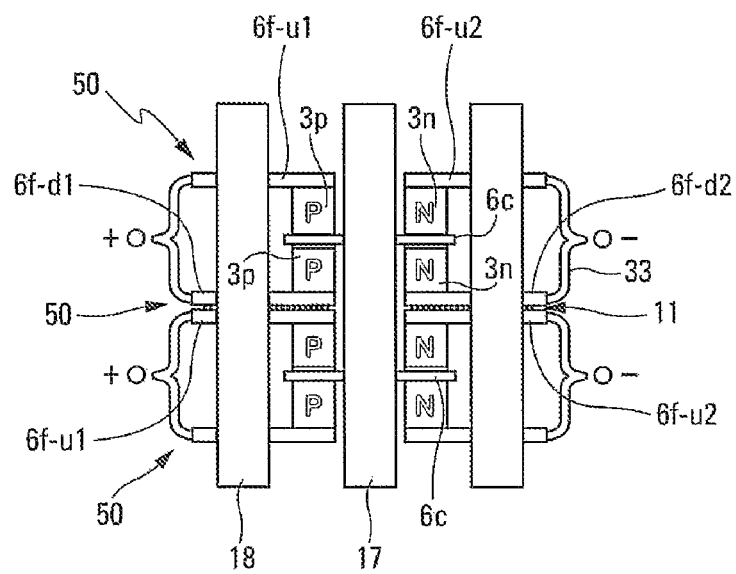

According to another exemplary implementation corresponding to a different pattern, illustrated in FIG. 4, only the cold fins $6f$ are grouped in pairs, called cold pairs 50, and said compressible material 11 is provided between the fins of one and the same pair for the cold pairs.

In this exemplary implementation, the cold pairs 50 alternate with the hot fins in the direction Y in such a way that at least one so-called cold pair is situated on either side of one so-called hot fin $6c$.

It will possible to provide at least two cold pairs in the extension of one another in the direction X and electrically insulated from one another.

According to the pattern illustrated in FIG. 4, said hot fin $6c$ is provided, for example, facing two cold fins $6f$-$u1$, $6f$-$u2$, of distinct cold pairs, called first and second upstream cold pairs, provided in the extension of one another, situated on one side of said hot fin, said hot fin $6c$ also facing two cold fins $6f$-$d1$, $6f$-$d2$, of distinct cold pairs, called first and second downstream cold pairs, situated in the extension of one another, on the other side of said hot fin $6c$.

One or more P-type elements are provided between said hot fin $6c$ and the cold fin $6f$-$u1$ of the first upstream cold pair. One or more N-type elements are provided between said hot fin $6c$ and the cold fin $6f$-$u2$, of the second upstream cold pair.

One or more N-type elements are provided between the hot fin $6c$ and the cold fin $6f$-$d2$, of the second downstream cold pair. One or more P-type elements are provided between the hot fin $6c$ and the cold fin $6f$-$u1$ of the first downstream cold pair. The upstream and downstream P-type elements are situated facing one another on either side of the hot fin $6c$. The same applies for the N-type elements.

With this pattern, it will be possible to use the following electrical connections. The cold fin 6f-u2 of the second upstream cold pair and the cold fin of the second downstream cold pair 6f-d2 are electrically connected so as to be at the same potential. The same applies to the cold fin 6f-u1 of the first upstream cold pair and the cold fin 6f-d1 of the first downstream cold pair.

Also, it will be possible to assemble the patterns as follows. The fins 6f-d1, 6f-u1 of the first upstream and downstream cold pairs of one of said hot fins 6c are set to the same potential as those associated with the following hot fins, in the direction Y. The cold fin of the first downstream cold pairs and the cold fin of the first upstream cold pairs associated with two successive hot fins 6c, in the direction Y, form part of the same pair of cold fins. The same applies for the fins 6f-d2, 6f-u2 of the second upstream and downstream cold pairs.

Although this is not represented, it will be possible to provide a bundle using the pattern of FIG. 4, with a number of ranks of hot pipes 17, oriented in the direction Y, each time inserted between two cold pipes 18, these also oriented in the direction Y, the hot and cold fins being oriented orthogonally to the pipes. As for the electrical connections, said ranks will, for example, be mounted in series.

One advantage of the two implementations of FIGS. 3 and 4 is that they make it possible to avoid thermal bridges between the hot components and the cold components, by virtue of the production of subassemblies of hot pipes and of hot fins, and of subassemblies of cold pipes and of cold fins, separated, even though they are interleafed, the only contact between these subassemblies occurring via the thermoelectric elements. In other words, there is an alternation between the N-type and P-type thermoelectric elements, in the direction X.

According to another different exemplary implementation, not represented, the hot pipes and the cold pipes are inserted between one another whereas the hot fins and the cold fins are inserted between one another, in planes at right angles to the pipes, the cold fins and/or the hot fins being optionally distributed in pairs, the fins of one and the same pair being separated by said compressible material.

As in the exemplary implementations of FIGS. 1 and 3 to 5, each cold fin, respectively hot fin, is provided with orifices for the passage of and thermal contact with the cold pipes, respectively hot pipes.

They are also provided with through-orifices without contact of with a thermally and electrically insulating contact with the hot pipes, respectively cold pipes.

Between a cold fin and a hot fin placed facing one another, there is provided thermoelectric elements of the same type. The fins of one and the same pair are set to same electrical potential. The cold fins are successively connected in series.

In the above, the expressions "electrically connected" or "set to the same potential" should be understood to mean that the tracks 32 provided on the fins are connected together from one fin to the other, for example using conductors 33.

On this subject, it can be noted that producing an electrical connection by the cold fins rather than by the hot fins is advantageous because this does not entail using electrical components rated to withstand high temperatures.

A description is given below of a method for manufacturing a device according to the invention. According to such a method, there is provided a step in which the thermoelectric elements are first assembled with the hot components, hot pipes 8 or hot fins 6c and are then assembled with the cold fins 5f, 6f.

The advantage of proceeding successively, in this order, is that it is possible to use relatively severe conditions of execution for the thermoelectric elements/hot components link and less severe conditions for the thermoelectric elements/cold fins link, without the latter risking being damaged by the execution of the thermoelectric elements/hot components link.

A link is ensured between the thermoelectric elements 3p, 3n and the tracks 32 of the fins 6f in a heat exchange relationship with the cold circuit, for example, by hard soldering. This is done with a hard soldering material having a relatively low melting point, for example below 600° C.

As for the link between, on the one hand, the thermoelectric elements 3p, 3n and, on the other hand, the tracks of the fins 6c in a heat exchange relationship with the hot pipes 9 or the tracks 34 of the hot pipes 8, it is produced, for example, by bonding.

One advantage in the choice of such methods is that each of the links created is adapted to the conditions of use of the device according to the invention.

The fins are stacked and, in a subsequent step, the cold pipes 9, 18 are assembled in the cold fins 5f, 6f. The same applies for the hot pipes 17 in the hot fins 6c in the embodiments with hot fins.

To ensure the pipes/fins link, as already described above, the pipes 9, 17, 18 in contact with the fins are then subjected, for example, to an expansion. This is, in particular, a radial expansion, obtained by the passage of an expansion olive inside the pipe, resulting in a crimping of the fins 5f, 6f, 6c on the pipes.

A bundle is thus obtained in which the hot pipes 8, 17 and the cold pipes 9, 18 form a framework by virtue of the stress exerted by the fins, once the latter are crimped on the pipes, without the need to add clamping tie rods. The pipes are then linked to collecting boxes. The fins are electrically linked together according to the different schemes described above.

The invention claimed is:

1. A thermoelectric device, comprising a first circuit, called hot circuit, through which a first fluid can flow, and a second circuit, called cold circuit, through which a second fluid can flow at a temperature lower than that of the first fluid, and elements, called thermoelectric elements, that can be used to generate an electric current in the presence of a temperature gradient, characterized in that it comprises fins in a heat exchange relationship with said hot circuit and/or said cold circuit, the thermoelectric elements being in contact at least with said fins, said fins having tracks for conducting the current generated by said thermoelectric elements;

in which the fins have a core made of metal material, provided with two faces, coated with a thermally conductive and electrically insulating substrate on at least one of the faces of the core, said tracks being provided on a face of the substrate opposite the face of the substrate in contact with the core; and in which the fins are grouped in pairs, a compressible material being provided between the fins of one and the same pair, said fins having tracks only on their face opposite that which is in contact with the compressible material.

2. The device as claimed in claim 1, in which the substrate is made of a ceramic material.

3. The device as claimed in claim 1, in which the tracks are made of copper.

4. The device as claimed in claim 1, in which said tracks extend to the periphery of the fins to form connection terminals.

5. The device as claimed in claim 4, in which electrical connectors are provided between at least some of said fins, said connectors being linked to said connection terminals to allow the fins that have said terminals to be set to the same potential.

6. The device as claimed in claim 1, in which:
the hot circuit comprises pipes, called hot pipes, for the circulation of the hot fluid,
said cold circuit comprises pipes, called cold pipes, for the circulation of the cold fluid,
said fins, called cold fins, are in a heat exchange relationship with the cold pipes,
the thermoelectric elements are in a heat exchange relationship, on the one hand, with the hot pipes and, on the other hand, with the cold fins.

7. The device as claimed in claim 6, in which the hot pipes are also provided with tracks for the conduction of the current generated by said thermoelectric elements.

8. The device as claimed in claim 1, in which:
said hot circuit comprises pipes, called hot pipes, for the circulation of the hot fluid,
said cold circuit comprises pipes, called cold pipes, for the circulation of the cold fluid,
for a first part, said fins, called cold fins, are in a heat exchange relationship with said cold pipes,
for the other part, said fins, called hot fins, are in a heat exchange relationship with said hot pipes,
said thermoelectric elements are provided in a heat exchange relationship, on the one hand, with the cold fins and, on the other hand, with the hot fins.

9. The device as claimed in claim 8, in which the cold fins are grouped in pairs, called cold pairs, a compressible material being provided between the fins of one and the same pair.

10. The device as claimed in claim 8, in which the cold fins and the hot fins are grouped in pairs, respectively called cold pair, hot pair, a compressible material being provided between the fins of one and the same pair for the cold pairs and the hot pairs.

11. The device as claimed in claim 1, in which the thermoelectric elements are hard soldered on the tracks of the fins in a heat exchange relationship with the cold circuit.

12. The device as claimed in claim 8, in which the thermoelectric elements are bonded to the tracks of the fins in a heat exchange relationship with the hot pipes.

13. The device as claimed in claim 7, in which the thermoelectric elements are bonded to the tracks of the hot pipes.

14. The device as claimed in claim 2, in which the tracks are made of copper.

15. The device as claimed in claim 1, in which said tracks extend to the periphery of the fins to form connection terminals.

16. The device as claimed in claim 2, in which said tracks extend to the periphery of the fins to form connection terminals.

17. The device as claimed in claim 3, in which said tracks extend to the periphery of the fins to form connection terminals.

18. The device as claimed in claim 14, in which said tracks extend to the periphery of the fins to form connection terminals.

19. A thermoelectric device, comprising a first circuit, called hot circuit, through which a first fluid can flow, and a second circuit, called cold circuit, through which a second fluid can flow at a temperature lower than that of the first fluid, and elements, called thermoelectric elements, that can be used to generate an electric current in the presence of a temperature gradient, characterized in that it comprises fins in a heat exchange relationship with said hot circuit and/or said cold circuit, the thermoelectric elements being in contact at least with said fins, said fins having tracks for conducting the current generated by said thermoelectric elements;
in which:
the fins have a core made of metal material, provided with two faces, coated with a thermally conductive and electrically insulating substrate on at least one of the faces of the core, said tracks being provided on a face of the substrate opposite the face of the substrate in contact with the core;
said hot circuit comprises pipes, called hot pipes, for the circulation of hot fluid,
said cold circuit comprises pipes, called cold pipes, for the circulation of the cold fluid,
for a first part, said fins, called cold fins, are in a heat exchange relationship with said cold pipes,
for the other part, said fins, called hot fins, are in a heat exchange relationship with said hot pipes,
said thermoelectric elements are provided in a heat exchange relationship, on the one hand, with the cold fins and, on the other hand, with the hot fins; and
the cold fins are grouped in pairs, called cold pairs, a compressible material being provided between the fins of one and the same pair.

20. A thermoelectric device, comprising a first circuit, called hot circuit, through which a first fluid can flow, and a second circuit, called cold circuit, through which a second fluid can flow at a temperature lower than that of the first fluid, and elements, called thermoelectric elements, that can be used to generate an electric current in the presence of a temperature gradient, characterized in that it comprises fins in a heat exchange relationship with said hot circuit and/or said cold circuit, the thermoelectric elements being in contact at least with said fins, said fins having tracks for conducting the current generated by said thermoelectric elements;
in which:
the fins have a core made of metal material, provided with two faces, coated with a thermally conductive and electrically insulating substrate on at least one of the faces of the core, said tracks being provided on a face of the substrate opposite the face of the substrate in contact with the core;
said hot circuit comprises pipes, called hot pipes, for the circulation of the hot fluid,
said cold circuit comprises pipes, called cold pipes, for the circulation of the cold fluid,
for a first part, said fins, called cold fins, are in a heat exchange relationship with said cold pipes,
for the other part, said fins, called hot fins, are in a heat exchange relationship with said hot pipes,
said thermoelectric elements are provided in a heat exchange relationship, on the one hand, with the cold fins and, on the other hand, with the hot fins; and
the cold fins and the hot fins are grouped in pairs, respectively called cold pair, hot pair, a compressible material being provided between the fins of one and the same pair for the cold pairs and the hot pairs.

* * * * *